(12) United States Patent
Domash et al.

(10) Patent No.: US 7,221,827 B2
(45) Date of Patent: May 22, 2007

(54) TUNABLE DISPERSION COMPENSATOR

(75) Inventors: Lawrence H. Domash, Conway, MA (US); Matthias Wagner, Cambridge, MA (US)

(73) Assignee: Aegis Semiconductor, Inc., Woburn, MA (US)

( * ) Notice: Subject to any disclaimer, the term of this patent is extended or adjusted under 35 U.S.C. 154(b) by 0 days.

(21) Appl. No.: 10/935,692

(22) Filed: Sep. 7, 2004

(65) Prior Publication Data

US 2005/0074206 A1    Apr. 7, 2005

Related U.S. Application Data

(60) Provisional application No. 60/519,249, filed on Nov. 12, 2003, provisional application No. 60/501,154, filed on Sep. 8, 2003.

(51) Int. Cl.
- *G02B 6/26* (2006.01)
- *G02B 6/42* (2006.01)
- *G02F 1/19* (2006.01)
- *H04B 10/18* (2006.01)

(52) U.S. Cl. .................. 385/47; 385/27; 385/89; 359/288; 359/337.5

(58) Field of Classification Search .......... None
See application file for complete search history.

(56) References Cited

U.S. PATENT DOCUMENTS

| | | | |
|---|---|---|---|
| 4,126,396 A | 11/1978 | Hartmann et al. | |
| 4,497,544 A | 2/1985 | Mitchell et al. | |
| 4,680,085 A | 7/1987 | Vijan et al. | |
| 4,885,622 A | 12/1989 | Uchiyama et al. | |
| 4,929,063 A | 5/1990 | Durand et al. | |
| 5,037,169 A | 8/1991 | Chun | |
| 5,072,120 A | 12/1991 | Siewick | |
| 5,162,239 A | 11/1992 | Winer et al. | |
| 5,185,272 A | 2/1993 | Makiuchi et al. | |
| 5,212,584 A * | 5/1993 | Chung | 359/260 |
| 5,218,422 A | 6/1993 | Zoechbauer | |
| 5,264,375 A | 11/1993 | Bang et al. | |
| 5,387,974 A | 2/1995 | Nakatani | |

(Continued)

FOREIGN PATENT DOCUMENTS

DE    4424717    1/1996

(Continued)

OTHER PUBLICATIONS

Madsen, et al., "A Multi-channel Dispersion Slope Compensation Optical Allpass Filter", Optical Fiber Communication Conference, (2000), pp. WF5-1, vol. 2.

(Continued)

*Primary Examiner*—Michelle Connelly-Cushwa
*Assistant Examiner*—Jerry T Rahll
(74) *Attorney, Agent, or Firm*—Kurt Rauschenbach; Rauschenbach Patent Law Group, LLC

(57) ABSTRACT

An optical dispersion compensator including: a spacer element having a top surface and a bottom surface; a thin film, multi-layer mirror formed on the top surface of the spacer element, the thin film mirror having a thermally tunable reflectivity; a highly reflective mirror element formed on the bottom surface of the spacer element; and a heater element for controlling a temperature of the thermally tunable thin film mirror.

20 Claims, 6 Drawing Sheets

U.S. PATENT DOCUMENTS

| | | | |
|---|---|---|---|
| 5,408,319 | A | 4/1995 | Halbout et al. |
| 5,490,008 | A | 2/1996 | Guempelein et al. |
| 5,515,460 | A | 5/1996 | Stone |
| 5,528,071 | A | 6/1996 | Russell et al. |
| 5,539,848 | A | 7/1996 | Galloway |
| 5,599,403 | A | 2/1997 | Kariya et al. |
| 5,619,059 | A | 4/1997 | Li et al. |
| 5,694,498 | A | 12/1997 | Manasson et al. |
| 5,708,280 | A | 1/1998 | Lebby et al. |
| 5,742,630 | A | 4/1998 | Jiang et al. |
| 5,751,757 | A | 5/1998 | Jiang et al. |
| 5,753,928 | A | 5/1998 | Krause |
| 5,767,712 | A | 6/1998 | Takemae et al. |
| 5,790,255 | A | 8/1998 | Jackson et al. |
| 5,812,582 | A | 9/1998 | Gilliland et al. |
| 5,814,871 | A | 9/1998 | Furukawa et al. |
| 5,942,050 | A | 8/1999 | Green et al. |
| 5,953,355 | A | 9/1999 | Kiely et al. |
| 6,018,421 | A | 1/2000 | Cushing |
| 6,037,644 | A | 3/2000 | Daghighian et al. |
| 6,075,647 | A | 6/2000 | Braun et al. |
| 6,091,504 | A | 7/2000 | Walker et al. |
| 6,166,381 | A | 12/2000 | Augeri et al. |
| 6,180,529 | B1 | 1/2001 | Gu |
| 6,194,721 | B1 | 2/2001 | Bly |
| 6,265,242 | B1 | 7/2001 | Komori et al. |
| 6,300,648 | B1 | 10/2001 | Mei et al. |
| 6,392,233 | B1 | 5/2002 | Channin et al. |
| 6,447,126 | B1 | 9/2002 | Hornbeck |
| 6,483,862 | B1 | 11/2002 | Aronson et al. |
| 6,487,342 | B1 | 11/2002 | Wu et al. |
| 6,545,796 | B1 | 4/2003 | Greywall |
| 6,670,599 | B2 | 12/2003 | Wagner et al. |
| 6,737,648 | B2 | 5/2004 | Fedder et al. |
| 6,768,097 | B1 | 7/2004 | Viktorovitch et al. |
| 6,985,281 | B2 | 1/2006 | Wagner et al. |
| 2001/0020680 | A1 | 9/2001 | Cunningham et al. |
| 2002/0033453 | A1 | 3/2002 | Sauer et al. |
| 2002/0080493 | A1 | 6/2002 | Tsai et al. |
| 2002/0105652 | A1 | 8/2002 | Domas et al. |
| 2002/0145139 | A1 | 10/2002 | Wagner et al. |
| 2002/0172239 | A1* | 11/2002 | McDonald et al. ........... 372/20 |
| 2002/0176659 | A1 | 11/2002 | Lei et al. |
| 2002/0181832 | A1 | 12/2002 | Feng et al. |
| 2002/0185588 | A1 | 12/2002 | Wagner et al. |
| 2002/0191268 | A1 | 12/2002 | Seeser et al. |
| 2003/0066967 | A1 | 4/2003 | Hashimoto et al. |
| 2003/0072009 | A1 | 4/2003 | Domash et al. |
| 2003/0087121 | A1* | 5/2003 | Domash et al. ............. 428/641 |
| 2003/0132386 | A1 | 7/2003 | Carr et al. |
| 2003/0141453 | A1 | 7/2003 | Reed et al. |
| 2004/0104334 | A1 | 6/2004 | Carr |

FOREIGN PATENT DOCUMENTS

| | | |
|---|---|---|
| DE | 19635583 A1 | 3/1998 |
| EP | 0125390 A1 | 11/1984 |
| EP | 0139487 | 5/1985 |
| EP | 0178148 A2 | 4/1986 |
| EP | 0518228 | 12/1992 |
| EP | 0559347 | 9/1993 |
| EP | 0773640 | 5/1997 |
| EP | 0859413 | 8/1998 |
| EP | 0860885 | 8/1998 |
| EP | 0883194 A1 | 12/1998 |
| EP | 0899835 A1 | 3/1999 |
| EP | 0899836 A1 | 3/1999 |
| EP | 0901170 | 3/1999 |
| EP | 1055959 | 11/2000 |
| JP | 60210826 | 10/1985 |
| JP | 07168040 | 7/1995 |
| JP | 08250551 | 9/1996 |
| WO | WO-89/03593 | 4/1989 |
| WO | WO-99/30394 | 6/1999 |
| WO | WO-00/13350 | 3/2000 |
| WO | WO-00/22479 | 4/2000 |
| WO | WO-00/23833 | 4/2000 |
| WO | WO-01/16637 | 3/2001 |
| WO | WO-01/67646 | 9/2001 |
| WO | WO-01/73850 | 10/2001 |
| WO | WO-02/50528 | 6/2002 |
| WO | WO-02/057180 | 7/2002 |
| WO | WO 02/103441 A1 | 12/2002 |
| WO | WO-03/046630 | 6/2003 |

OTHER PUBLICATIONS

Gnauck, et al., "Optical Equalization of Fiber Chromatic Dispersion in a 5-Gb/s Transmission System", IEEE Photonics Technology Letters, (1990), pp. 585-587, vol. 2(8).

Brown, "Optical Fibres and Telecommunications, Lecture 4- Compensating Dispersion".

Delsavo, et al., "Advanced Components and Subsystem Solutions for 40 Gb/s Transmission", *Journal of Lightwave Technology*, (2002), pp. 2175-2177, vol. 20(12).

Domash, et al., "Switchable thin film ass/drop filter", Optical Society of America, (2003), PD35-1-PD35-3.

Domash, et al., "Tunable and Switchable Multiple-Cavity Thin Film Filters", *Journal of Lightwave Technology*, (2004), pp. 126-135, vol. 22(1).

Domash, et al., "Tunable thin-film filters based on thermo-optic semiconductor films", *Applications of Photonic Technology*, 5, Proceedings of SPIE, (2002), pp. 685-695, vol. 4833.

IBM Research, Zurich Research Laboratory, SiON PLC Technology, "Tunable Dispersion Compensator: Preliminary Product Description".

Jablonski, et al., "Entirely Thin-Film Allpass Coupled-Cavity Filters in a Parallel Configuration for Adjustable Dispersion-Slope Compensation", *IEEE Photonics Technology Letters*, (2001), pp. 1188-1190, vol. 13(11).

Lunardi, et al., "Tunable Dispersion Compensation at 40-Gb/s Using a Multicavity Etalon All-Pass Filter with NRZ, RZ, and CS-RZ Modulation", *Journal of Lightwave Technology*, (2002), pp. 2136-2144, vol. 20(12).

Madsen, et al., "A Tunable Dispersion Compensation MEMS All-Pass Filter", *IEEE Photonics Technology Letters*, (2000), pp. 651-653, vol. 12(6).

Moss, et al., "Multichannel tunable dispersion compensation using all-pass multicavity etalons", Optical Society of America (2002).

Willner, "Chromatic Dispersion and Polarization-Mode Dispersion: Managing Key Limitations in Optical Communication Systems", OPN Trends, (2002), pp. 16-21.

Riant, Isabelle, et al., Chirped Fiber Bragg Gratings For WDM Chromatic Dispersion Compensation In Multispan 10-Gb/s Transmission, IEEE Journal Of Selected Topics In Quantum Electronics, Sep./Oct. 1999, pp. 1312-1323, vol. 5, No. 5.

U.S. Appl. No. 09/813,447.
U.S. Appl. No. 09/813,449.
U.S. Appl. No. 09/813,450.
U.S. Appl. No. 09/813,454, Wayne et al.
U.S. Appl. No. 09/813,455.
U.S. Appl. No. 09/813,456, Wagner et al.
U.S. Appl. No. 09/813,462, Wagner et al.
U.S. Appl. No. 60/480,294, filed Jun. 20, 2003, Wagner et al.
U.S. Appl. No. 60/509,379, filed Oct. 7, 2003, Ma et al.

Augustine, B.H. et al. "Thermal-optical switching of a silicon based interference filter" J. Appl. Phys. (Feb. 15, 1994): 75(04) 1875-1877.

Baumeister, P., "Simulation of a rugate filter via a stepped-index dielectric multilayer", *Applied Optics*, vol. 25, No. 16, pp. 2644-2645, 1986.

Bruel et al., "Smart-cut: A New Silicon on Insulator Material Technology based on Hydrogen Implantation and Wafer Bonding", *Jpn. J. Appl. Phys.*, vol. 36, pp. 1636-1641, 1997.

Carbunescu, E. "Non linear optical effects in hydrogenated amorphous silicon" *Optical Engineering*, vol. 35, No. 05, pp. 1322-1324, May 1996.

Choi et al. "Design and Control of a Thermal Stabilizing System for a MEMS Optomechanical Uncooled Infrared Imaging Camera", *Sensors and Actuators*, vol. 203, No. A104, pp. 132-142.

Cocorullo, G. et al. "Amorphous silicon waveguides and light modulators for integrated photonics realized by low-temperature plasma-enhanced chemical-vapor deposition." *Optics Letters*, vol. 21, No. 4, pp. 2002-2004, Dec. 15, 1996.

Cocorullo, G. et al. "Amorphous silicon waveguides and interferometers for low-cost silicon optoelectronics." *SPIE*, vol. 3278, pp. 286-292, 1998.

Cocurullo, G. et al. "Amorphous silicon based waveguides and light modulators for silicon low-cost photonic integrated circuits." *MRS Fall Meeting Boston* (Dec. 1997).

Cocorullo, G. et al., "Amorphous silicon-based guided-wave passive and active devices for silicon integrated optoelectronics", *IEEE Journal of Selected Topics in Quantum Electronics*, vol. 4, No. 6; pp. 997-1002, Nov./Dec. 1998.

Cocorullo et al., "Fast Infrared Light Modulation in a-Si:H Microdevices", *J. Non-Crystalline Sol.*, vol. 266, pp. 1247-1251, 2000.

Cocorullo, G. et al., "Measurement of the thermo-optic coefficient of a-Si:H at the wavelength of 1500 nm from room temperature to 200° C.", *Journal of Non-Crystalline Solids*, pp. 310-313, 2002.

Cocorullo, G. et al., "Silicon thermooptical micromodulator with 700-KH$_z$-3dB bandwidth." *IEEE Photonics Technology Letters*, vol. 7, No. 4, pp. 363-365, Apr. 1995.

Coppola, G. et al. "Simulation and analysis of a high-efficiency silicon optoelectronic modulator based on a Bragg mirror." *Society of Photo-optical Instrumentation Engineers* (Jun. 2001): 40(6) 1076-1081.

Della Corte, F. et al., "Study of the thermo-optic effect in hydrogenated amorphous silicon and hydrogenated amorphous silicon carbide between 300 and 500 K at 1.55 μm", *Applied Physics Letters*, vol. 79, No. 2, pp. 168-170, Jul. 9, 2001.

Domash et al., "Broadly Tunabel Thin Film Interference Coatings: Active Thin Film for Telecom Applications", *Proceedings of SPIE*, vol. 4989, pp. 161-167, Jun. 2003.

Eicker, U. et al. "Optical bistability in amorphous Si-C alloys and amorphous alloy interference filters." *Optical Society of America*, vol. 8, No. 3, pp. 614-617, 1991.

Fernandes, M. et al., "VIS/NIR detector based on uc-Si:H p-l-n structures", *Thin Solid Films, Elsevier Science, S.A.*, vol. 364, No. 1-2, pp. 204-205, Mar. 2000.

Ghosh, G., "Temperature dispersion of refractive indices in crystalline and amorphous silison", *Appl. Phys. Lett. 66*, vol. 26, Jun. 26, 1995.

Hohlfeld et al., "A Thermally Tunable Silicon-based Optical Filter", *Sensors and Actuators*, vol. 103, No. 1-2, pp. 93-99, Jan. 15, 2003.

Hohlfeld et al., "Thermally Tunable Optical Filter Array", *Proceedings of SPIE—Optical Devices for Fiber Communication IV*, vol. 4989, pp. 143-154, Jun. 2003.

Iodice, M. et al. "Simple and low-cost technique for wavelength division multiplexing channel monitoring." *Society of Photo-Optical Instrumentation Engineers*, vol. 69, No. 6, pp. 1704-1711, Jun. 2000.

JDSU COADM Configurable Optical Add Drop Multiplexers, http://www.jdsu.com/site/images/products/pdf/coadm_apnote, pdf.

Kajava, T. et al. "Tunable fabry-perot micro-filters for telecommunication system diagnostics." *Tech Dig. Conf. Lasers and Electro-Optics Cleo/Europe*, p. 324, 1998.

Kobayashi, Y. et al., "Improvement on Coupling Efficiency for Passive Alignment of Stacked Mult-Fiber Tapes to a Vertical-Cavity Surface-Emitting Laser Array", *Extend Abstracts of the 1996 International Conference on Solid State Devices and Materials*, pp. 655-657, 1996.

Li, H., "Refractive Index of Silicon and Germanium and its Wavelength and Temperature Derivatives", *J. Phs. and Chem. Ref. Data.*, vol. 9, p. 561, 1980.

Lequime, M. et al., "Toward tunable thin-film filters for wavelength division multiplexing applications", *Applied Optics*, vol. 41, No. 16, pp. 3277-3284, Jun. 1, 2002.

Mandurah, M.M., "Dopant Seregation in Polycrystalline Silicon", *J. App. Phys.*, vol. 51, pp. 5755-5763, 1980.

Martinu, L., "Plasma deposition of optical films and coatings: A review", *J. Vac. Sci. Technol.*, vol. 18, No. 6, pp. 2619-2645, Nov./Dec. 2000.

Niemi, T. et al. "Tunable silicon etalon for simultaneous spectral filtering and wavelength monitoring of a DWDM transmitter." *IEEE Photoconics Technology Letters* (Jan. 2001): 13(1) 58-60.

Oden et al., "Uncooled Thermal Imaging Using a Piezoresitive Microcantilever", *Health Science Research Division, Oak Ridge National Laboratory*, (3 pages), 1996.

Pangal, K. et al., "Hydrogen plasma enhanced crystallization of hydrogenated amorphous silicon films", *Journal of Applied Physics*, vol. 85, No. 3, pp. 1900-1906, Feb. 1, 1999.

Parmentier, R. et al., "Substrate-strain-induced tunability of dense wavelength-division multiplexing thin-film filters", *Optic Letters*, vol. 28, No. 9, pp. 728-730, May 1, 2003.

Parametier, R. et al., "Towards tunable optical filters", *Technical Digest, OSA Topical Meeting Optical Interference Coatings*, Paper WB1, Jul. 15, 2001.

Payne et al., "Effects of Chlorine on Dopant Activation in α-Si:H", *Appl. Phys. Lett.*, vol. 76, No. 20, p. 2949, 2000.

Polyakov et al., "Processability and Electrical Characteristics of Glass Substrates for RF Wafer-Level Chip-Scale Packages", *2003 Proceedings 53rd, Electronic Components and Technology Conference*, vol. CONF. 53, May 27, 2003.

Riant et al., "Chirped Fiber Bragg Gratings for WDM Chromatic Dispersion Compensation in Multispan 10-Gb/s Transmission", *IEEE Journal of Selected Topics in Quantum Electronics*, vol. 5, No. 5., pp. 1312-1323, 1999.

Schmidt, M. A., "Wafer-to-wafer Bonding for Microstructure Formation", *Proc. IEEE*, vol. 86, pp. 1575-1585, 1998.

Song et al., "Fabrication of Single Crystalline Silicon on Glass by Smart-Cut Technique", *Chinese Physics Letters*, vol. 20, No. 1, pp. 108-110, Jan. 2003.

Takashashi, H., "Temperature stability of thin-film narrow-bandpass filters produced by ion-assisted deposition", *Applied Optics*, vol. 34, No. 4, pp. 667-675, Feb. 1, 1995.

Tsai, Ry. et al., "Amorphous silicon and amorphous silicon nitride films prepared by a plasma-enhanced chemical vapor deposition process as optical coating materials", *Applied Optics*, vol. 32, No. 28, pp. 5561-5566, Oct. 1, 1993.

Takagi et al., "High-rate Growth of Stable α-Si:H", *Mat. Res. Soc. Symp. Proc.*, vol. 557, p. 105, 1999.

Wipiejewski et al., "Vertical-Cavity Surface-Emitting Laser Diodes for Short Distance Optical Fiber Networks", *Proceedings of the Electronic Components and Technology Conference*, Washington DC, IEEE, vol. 44, pp. 330-334, 1994.

Yang et al., "Amorphous Silicon and SiGe Alloy Solar Cells Deposited by VHF", *Mat. Res. Soc. Symp.*, vol. 664, p. A11.3.1, 2001.

Zhao et al., "Optomechanical Uncooled Infrared Imaging System: Design, Microfabrication, and Performance", *Journal of Microelectromechanical Systems*, vol. 11, No. 2, pp. 136-146, 2002.

* cited by examiner

TUNABLE DISPERSION COMPENSATOR

This application claims the benefit of U.S. Provisional Application No. 60/501,154, filed Sep. 8, 2003, and U.S. Provisional Application No. 60/519,249, filed Nov. 12, 2003.

TECHNICAL FIELD

This invention relates to dispersion compensation.

BACKGROUND OF THE INVENTION

The problem to be addressed relates to fiber optic communication systems used to transport digital data and more specifically to chromatic dispersion in such systems. Chromatic dispersion is the process by which an optical pulse spreads out as it propagates in any medium which does not have absolutely constant speed of light vs. wavelength. An optical fiber is such a medium and devices such as thin film filters or optical amplifiers also contribute to dispersion.

For example, at a 10 GHz data rate, a "1" pulse representing the digital "1" is about 100 ps duration in time or 3 cm long in space. The basics of Fourier analysis show that a laser signal modulated to carry such pulses is no longer a single pure frequency plane wave but is composed of a range of frequencies about 10 GHz on each side of the central optical frequency (for example 197 THz, i.e., from 196.99 to 197.01 THz, which corresponds to a wavelength range of 0.08 nm). If the speed of light in the system varies enough over this frequency range, the pulse shape will be smeared by the time it gets to its destination, which might be 100 km away. As a result, the "1's" are confused with the "0's", and the data is lost. For one pulse to be confused with the next over a path of 100 km, it is only necessary that the speed of light in the fiber vary by one part in $10^8$ over the 10 ghz bandwidth.

For optical fiber dispersion measurement purposes, the quantity of interest is group delay per unit length, which is the reciprocal of the group velocity of a particular mode. The measured group delay of a signal through an optical fiber exhibits a wavelength dependence due to the various dispersion mechanisms present in the fiber. Group delay at a given wavelength is measured in ps and its slope in ps/nm, or equivalently in terms of the third derivative of phase shift, whose units are $ps^2$. Chromatic dispersion is measured in terms of the rate of change of group delay as a function of wavelength. In other words, it is measured in ps/nm/km, i.e., ps of differential delay per nm of wavelength per km of travel distance. So, total dispersion can be as much as −5000 to +5000 ps/nm.

Dispersion is reversible if elements that have opposite effects on the speed of the light at the various wavelengths are inserted into the pulse path. For example, if red travels more slowly in the fiber than does blue, then an element that slows down the blue in comparison to the red will undo the effects caused by traveling through the fiber. That is, such an element can reverse the dispersion, restore the pulse shape and thus "fix" the pulses.

Dispersion compensation means introducing into the network some optical element, which by providing an equal and opposite dispersion characteristic undoes the dispersion caused by other elements. The problem of dispersion caused by fiber spans or amplifiers or other devices in 10 or 40 Gb/s networks and the need for compensation of these effects is described in A. Willner, OPN Trends, March 2002, p S-16, Optical Soc America, which also discusses methods of tunable dispersion compensation using fiber Bragg gratings.

There are special fibers which have this dispersion compensating property. They are used by periodically placing short lengths of this special fiber in the network to offset the accumulated dispersion. This is not an optimum fix, however. In addition, there is no mechanism to adjust it short of uninstalling it.

Another adjustment mechanism is a special fiber Bragg grating which is designed with a "chirp" and used in a reflection setup with a fiber circulator. The chirp is such that the grating period is altered along the length of the grating. When a pulse is reflected from the grating, the blue light has to travel deeper into the fiber to find its resonant grating and get reflected; than does the red light which is reflected nearer the beginning. The result is that the delay time varies with wavelength and measured dispersion can be artificially introduced. Some tunable versions of the special fiber Bragg grating have been introduced that involve mechanically stretching the fiber.

Methods using coupled Gires-Turnois etalons are discussed in Lunardi et al, J. Lightwave Tech., Vol 20, p.2136, December 2002. And methods using a pair of thin film filters are discussed in M. Jablonski et al, IEEE Phot. Tech. Lett. Vol. 13, p.1188, November 2001.

The merit of a tunable dispersion compensation technique is determined by the range of group delay dispersion, the compensation bandwidth, the smoothness of this in terms of ripple in ps over the compensation bandwidth, and whether the compensation applies to one single channel for a given device or for all the channels in a WDM datastream. Other desiderata include simplicity, small size and low power requirement, ruggedness, and low cost of manufacture.

No known tunable dispersion compensator, whether based on fiber gratings, etalons, waveguides, free space optics or other techniques is as yet fully satisfactory for industry requirements. So, the search for a better tunable dispersion compensator continues.

SUMMARY OF THE INVENTION

In general, in one aspect, the invention features devices that are capable of dynamically adjusting or tuning the amount of dispersion compensation in response to network connectivity changes or drifting conditions.

In general, in another aspect, the invention features a Gires-Turnois etalon with a thermo-optically tunable thin film mirror of variable reflectivity on one side of the cavity and a highly reflective mirror on the other side of the cavity.

In general, in still another aspect, the invention features an optical dispersion compensator including: a spacer element having a top surface and a bottom surface; a thin film, multi-layer mirror formed on the top surface of the spacer element, the thin film mirror having a thermally tunable reflectivity; a highly reflective mirror element formed on the bottom surface of the spacer element; and a heater element for controlling a temperature of the thermally tunable thin film mirror.

Other embodiments have one or more of the following features. The thermally tunable thin film mirror is a multi-layer thin film interference structure, e.g. a thermo-optically tunable thin film mirror. The spacer, the thermo-optically tunable thin film mirror, and the highly reflective mirror in combination form a thermally tunable optical element, and the optical dispersion compensator further includes: an input optical fiber arranged to deliver an optical signal to the thermally tunable optical element through the optical filter;

and an output optical fiber arranged to receive an optical signal that has been reflected by said thermally tunable optical element. The thermally tunable optical element is an all-pass filter. The highly reflective mirror is a thin film of metal (e.g. a gold film). Alternatively, the mirror is a dielectric thin film stack. The thermo-optically tunable thin film mirror is made of a semiconductor material (e.g. silicon or amorphous silicon). The heater element is a resistive layer formed as a layer within the thermo-optically tunable thin film mirror or it is a ring heater formed on one surface of the thermo-optically tunable thin film optical filter. The optical dispersion compensator also includes a dual fiber collimator (e.g. a GRIN lens), which optically couples the first and second optical fibers to the thermally tunable optical element.

In general, in still yet another aspect, the invention features an optical dispersion compensator including: a Gires-Tournois etalon with a spacer section having a top surface supporting a thin film, multi-layer mirror having a thermally tunable reflectivity and a bottom surface supporting a mirror element; and a heater element for controlling a temperature of the thermally tunable thin film mirror.

Other embodiments include one or more of the following features. The thermally tunable thin film mirror is a multi-layer thin film interference structure (e.g. a thermo-optically tunable thin film mirror). The spacer, the thermally tunable thin film mirror, and the bottom mirror in combination form a thermally tunable optical element, and the optical dispersion compensator further includes: an input optical fiber arranged to deliver an optical signal to the thermally tunable optical element through the optical filter; and an output optical fiber arranged to receive an optical signal that has been reflected by said thermally tunable optical element. The optical dispersion compensator also includes a dual fiber collimator (e.g. a GRIN lens), which optically couples the first and second optical fibers to the thermally tunable optical element. The optical dispersion compensator also includes a second heater element for controlling a temperature of the spacer.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
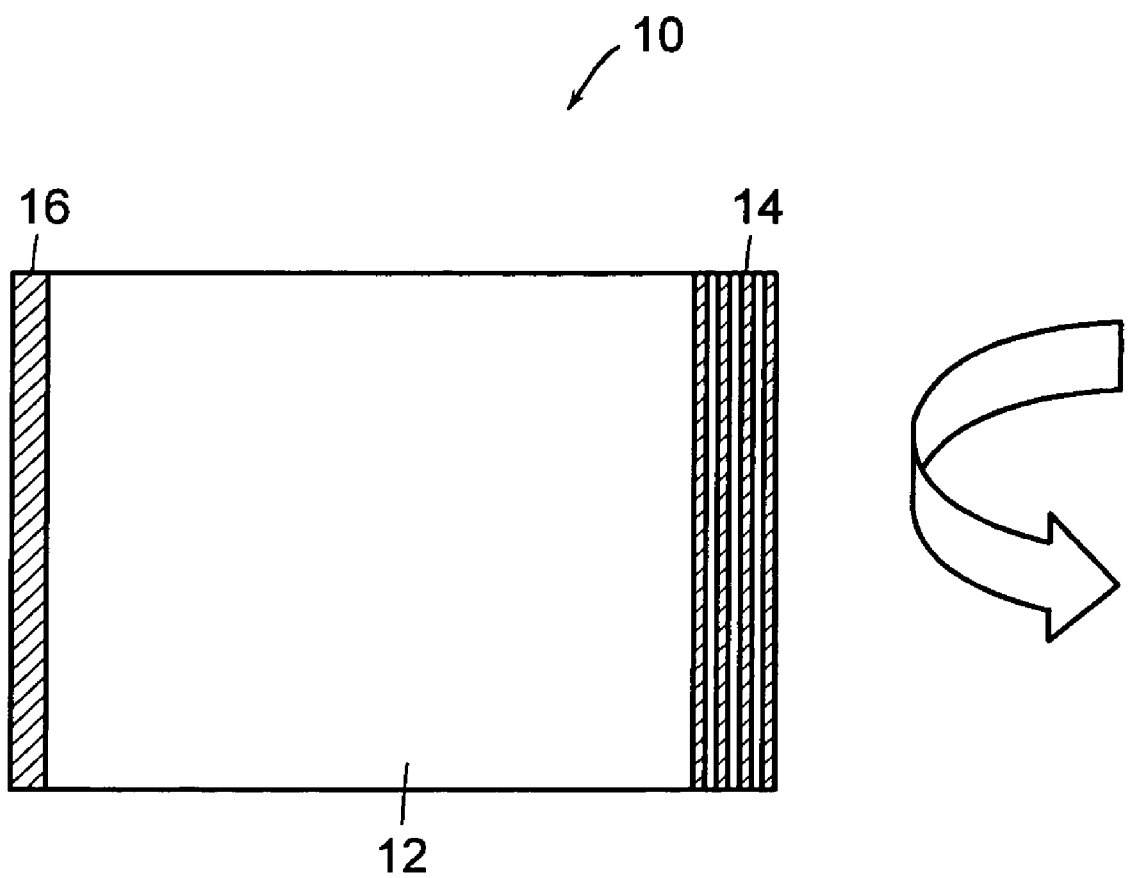
FIG. 1 shows the basic structure of a thermo-optically tunable Gires-Tournois etalon.

FIG. 1 shows a Gires-Tournois (GTI) etalon 10 which includes a silica spacer 12 with a thermo-optically tunable thin film reflective structure 12 on one side and a highly reflecting mirror 14 on the opposite side. The thermo-optically tunable thin film reflective structure, which is described in greater detail later, is basically a multi-layer thin film interference structure which functions as a partially reflecting mirror. By itself, it exhibits a reflectivity which varies as a function of wavelength. Varying the temperature of this thin film interference structure shifts the spectral reflectivity curve as a function of the temperature of the film. When viewed from the point of view of a particular fixed wavelength of operation, this amounts to an adjustable reflectivity. Hence, when used as the front mirror in a GTI, the thermo-optically tunable thin film filter produces a tunable pulse delay and tunable dispersion.

A Fabry-Perot etalon, in contrast to the GTI interferometer, has two symmetric mirrors of equal reflectivity separated by a gap of spacer element. It is typically used in a transmission mode and displays the familiar Lorentzian transmission band pass spectral shape as its defining characteristic. The dispersion characteristic of such a device is benign, since the phase shift and hence group delay varies monotonically with wavelength. Normally, of course, this is a fixed, not tunable characteristic.

However it is normally impossible to use a Fabry-Perot as a dispersion compensating element because if the Fabry-Perot etalon is operated as a transmission filter, then not only will its group delay vary as a function of wavelength but so will its transmission also vary as a function of wavelength. By replacing the Fabry-Perot etalon with the GTI structure, the device becomes reflective as a whole. And it is possible to vary group delay while keeping the throughput (i.e., the light that is reflected) constant or nearly constant with wavelength. Converting the Fabry-Perot into the Gires-Tournois, which is wholly reflective at all wavelengths, is accomplished by making one of its mirrors 100% reflective. Such a filter is called an "all pass" filter.

The reflectivity of the front-most (second) mirror determines the amount of group delay and group delay dispersion. This may be intuitively understood by envisioning a short pulse of light entering the etalon at the resonant wavelength and bouncing between the two mirrors many times before exiting. Roughly speaking, with more highly reflective mirrors, there will be more bounces before the pulse exits and the pulse delay time will be greater. This also means a steeper slope (i.e., greater group delay dispersion) is associated with higher reflectivity mirrors. If a method is employed to control and dynamically adjust the front-most mirror reflectivity, this time of capture will also be controlled and hence the device as a whole becomes a tunable dispersion compensator.

If a thick etalon is used, multi-channel operation is possible by virtue of the well known property of free spectral range (FSR). That is, the properties will more or less repeat at a fixed wavelength step that can be made to coincide with the channel spacing. Using a thick etalon causes for all optical properties to recur spectrally at known intervals, which can be arranged for example to coincide with the ITU grid for WDM (wave division multiplex) channels. For example, for use on a 100 GHz grid, a fused silica etalon that is 1.042 mm thick will yield repetition of all properties every 100 GHz in the neighborhood of 1550 nm. This repetition may not be exact. For many applications it will suffice in practice if a few adjacent channels can be compensated in parallel.

In the described embodiment, the etalon is a thick slab of fused silica. In the resulting structure, the adjustable mirror can be tuned to adjust the dispersion slope while keeping the wavelength fixed. In practice the wavelength at which this is optimum may not be perfectly static in which case a second control can be included to independently tune the temperature of the fused silica etalon to keep the wavelength fixed. The second control operates by finely adjusting the thickness of the overall cavity through thermal expansion and contraction of the fused silica spacer or else by virtue of the thermo-optic index coefficient of the fused silica. This other tuning control can be used to keep the filter curve centered while the mirror reflectivity is adjusted by imposing relatively much greater changes in the temperature of the front mirror stack.

Also provided, but not shown in FIG. 1, is one of several mechanisms for heating and/or cooling the film over a wide temperature range. Possible mechanisms include: using a transparent conductive film in the stack which is heated by passing an electrical current through it; bonding the etalon to a doped silicon wafer that is heated by passing current through it; depositing a metallic film ring heater onto the film stack; placing the device in an oven; etc. Instead of using electrical current to heat the heating element, one could use other techniques such as irradiating the structure with a light at a different wavelength from the signal wavelength but a wavelength that is absorbed by a heating layer in the device.

Figure 2:
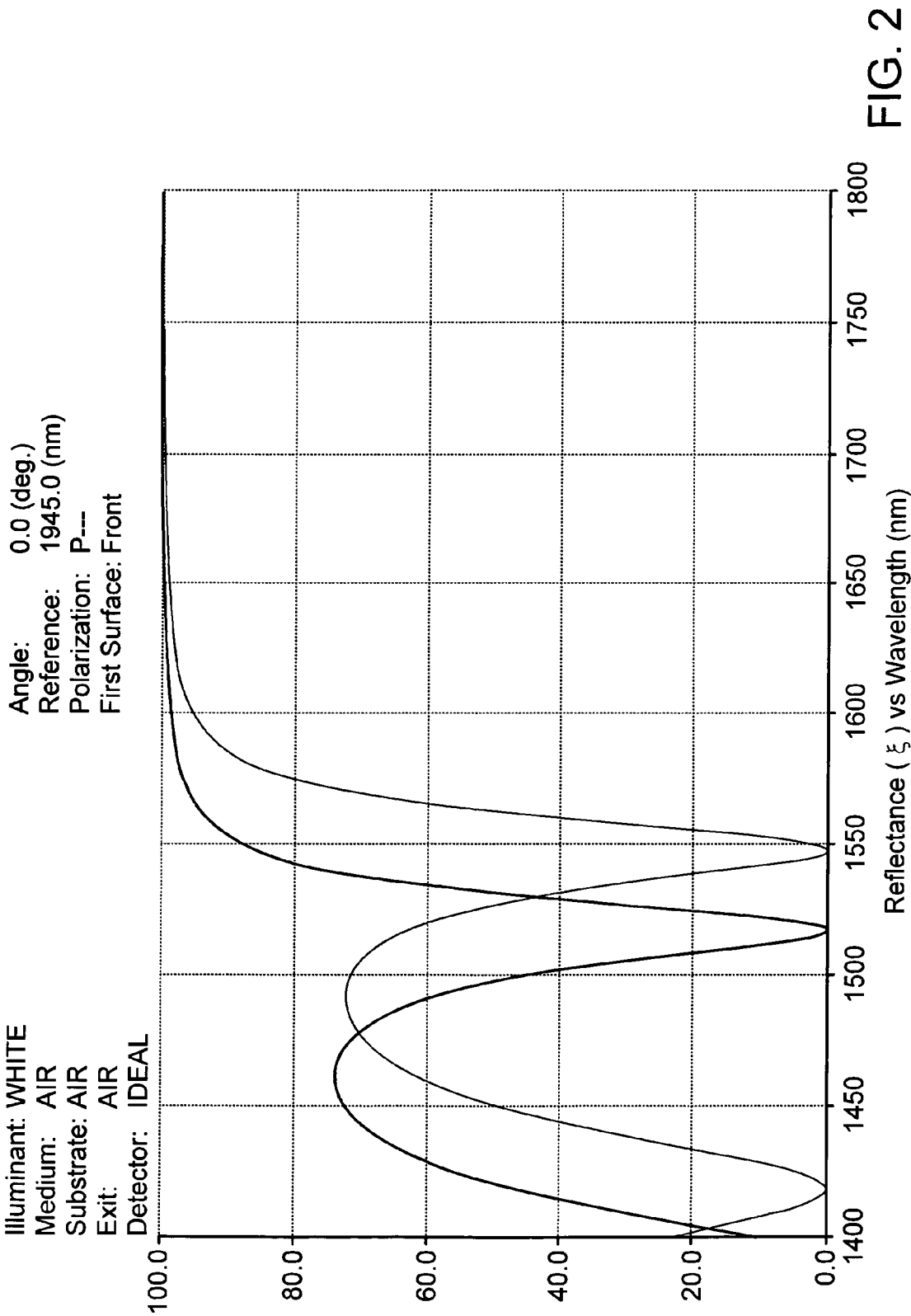
FIG. 2 shows the reflectivity of a mirror stack at two different temperatures.

Operation:

FIG. 2 shows the reflectivity of a mirror stack whose reference wavelength for deposition of quarter wave films is defined as 1945 nm. As shown, this results in the "stop band edge" falling at 1550 nm, which is thereby a spectral region of rapid change from low to high reflectivity. The two curves are for two temperatures, namely, room temperature and 325° C., which temperatures are convenient and practical for the manipulation of the materials used. As the temperature is varied, light at 1550 nm will experience a large change in reflectance from nearly 0 to 87%. This, in turn, will result in a large change in the effective Fabry Perot finesse and associated time delay for optical pulses. It correspondingly results in a large change in the rate of change of time delay with wavelength, which is dispersion.

Figure 3:
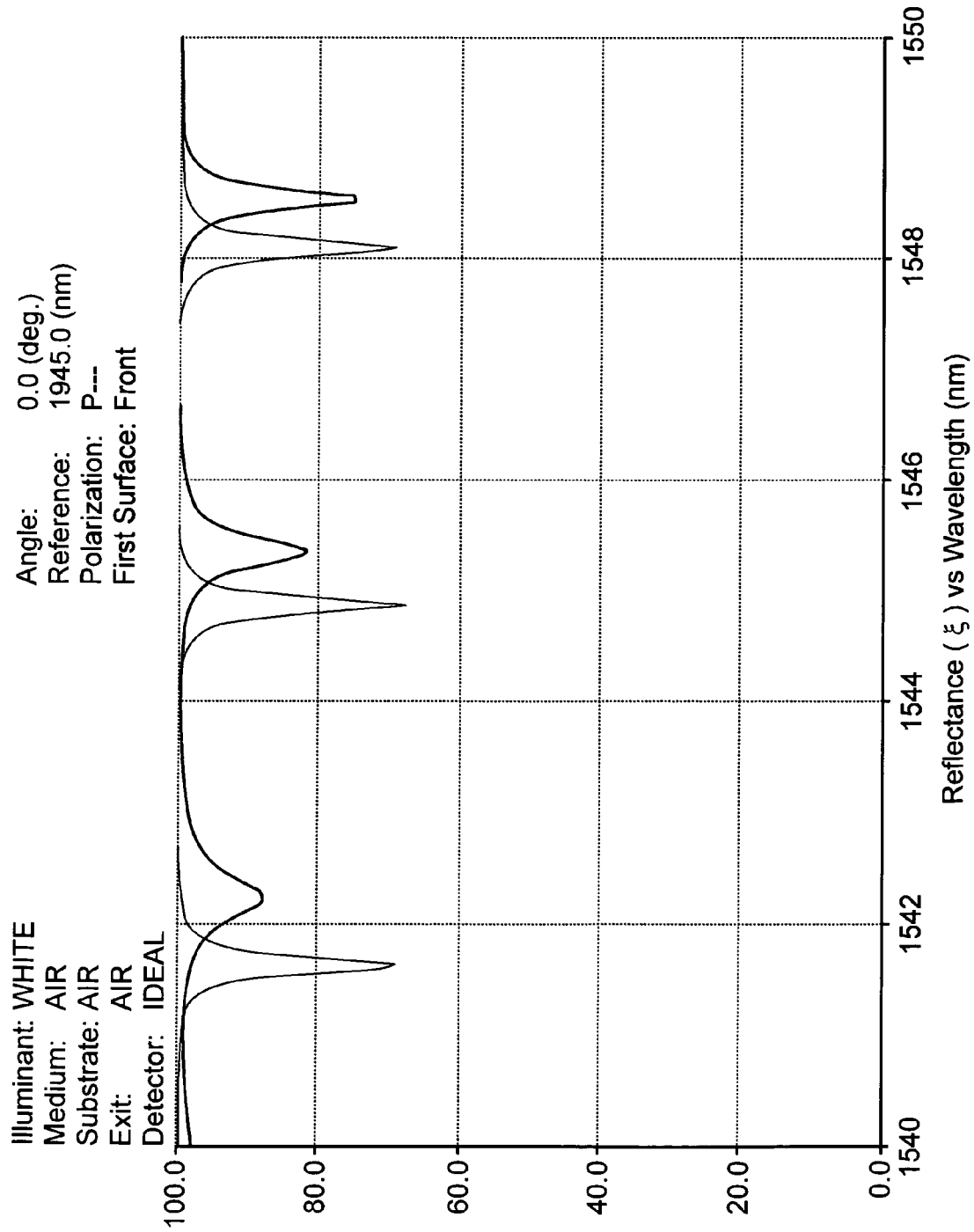
FIG. 3 shows the reflectivity of a thermo-optically tunable etalon between 1540 and 1555 nm at two different temperatures.

FIG. 3 shows the reflection spectrum for a band of a few nm around 1550 nm for the device of FIG. 1. The etalon's reflectivity is shown for two temperatures which produce a 4% change in the a-Si:H index of refraction, considered to be the practical operating range for index variation by thermo-optic means. The back mirror is made of a 100 nm thick gold film, or alternatively a non-thermo-optic stack of many pairs of high and low index dielectric materials, and has a reflectivity approaching 100%. The thermo-optic mirror stack is made by growing alternating layers of amorphous silicon and silicon nitride on top of each other the produce a periodic structure of the form: H L H L H L H L H L H L H L, wherein H=amorphous silicon and L=silicon nitride. In this case, the "H L" film pair was repeated seven times to form the stack. The etalon is fused silica that is 1.04 mm thick. The spectrally periodic nature of the optical properties resulting from using a thick etalon is also shown. Note that the reflectivity, although varying slightly from channel to channel and as the temperature changes, always exceeds 70%, which produces an acceptable level of insertion loss. For practical applications, it is not necessary that the device characteristics remain similar for more than a few adjacent channels.

While a film stack formula of the form HLHLHLHLHLHLHL performs the function of providing a reflection "stop band" in wavelength at the edge of which the required rapid slope of reflectivity takes place, for some applications it may be advantageous to adjust the film stack formula from this simple form. For example, if a slightly altered spectral shape and hence altered rate or smoothness of reflectivity change is desired, or if ripples exist in the mirror characteristic, well known methods of thin film design can be utilized to adjust and optimize each individual layer to accomplish this. In this case, the stack of films may not be quarter waves but rather a formula such as:

0.81 H 0.49 L 0.59 H 0.25 L . . . etc.

This technique can be used to make adjustments in the device characteristics which may be essential to meeting system specifications. Standard industry software exists to perform this design function based on a target spectral reflectivity curve, for example, TFCalc made by Software Spectra, Inc.

Figure 4:
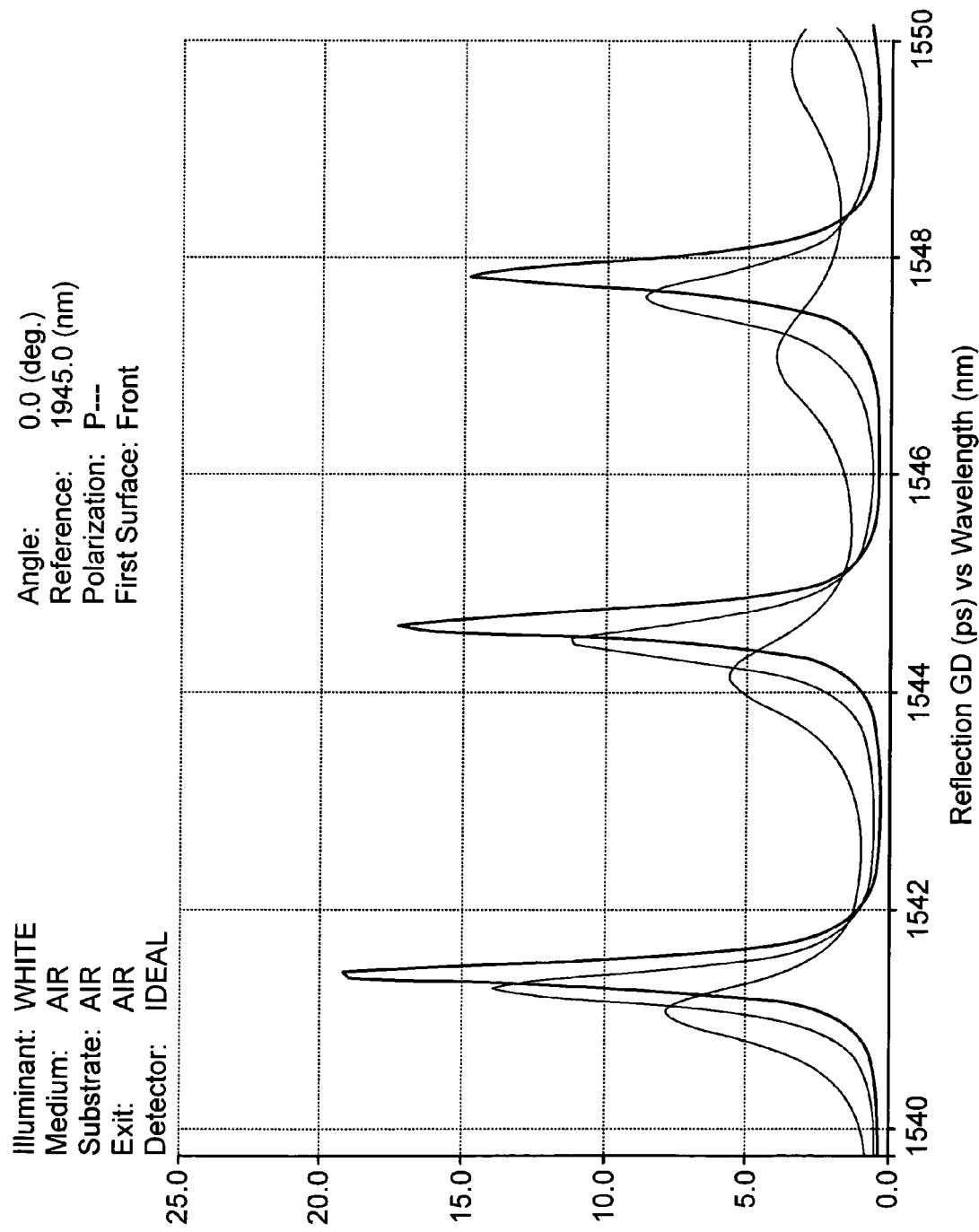
FIG. 4 shows the group delay of the etalon at three different temperatures.
Figure 5:
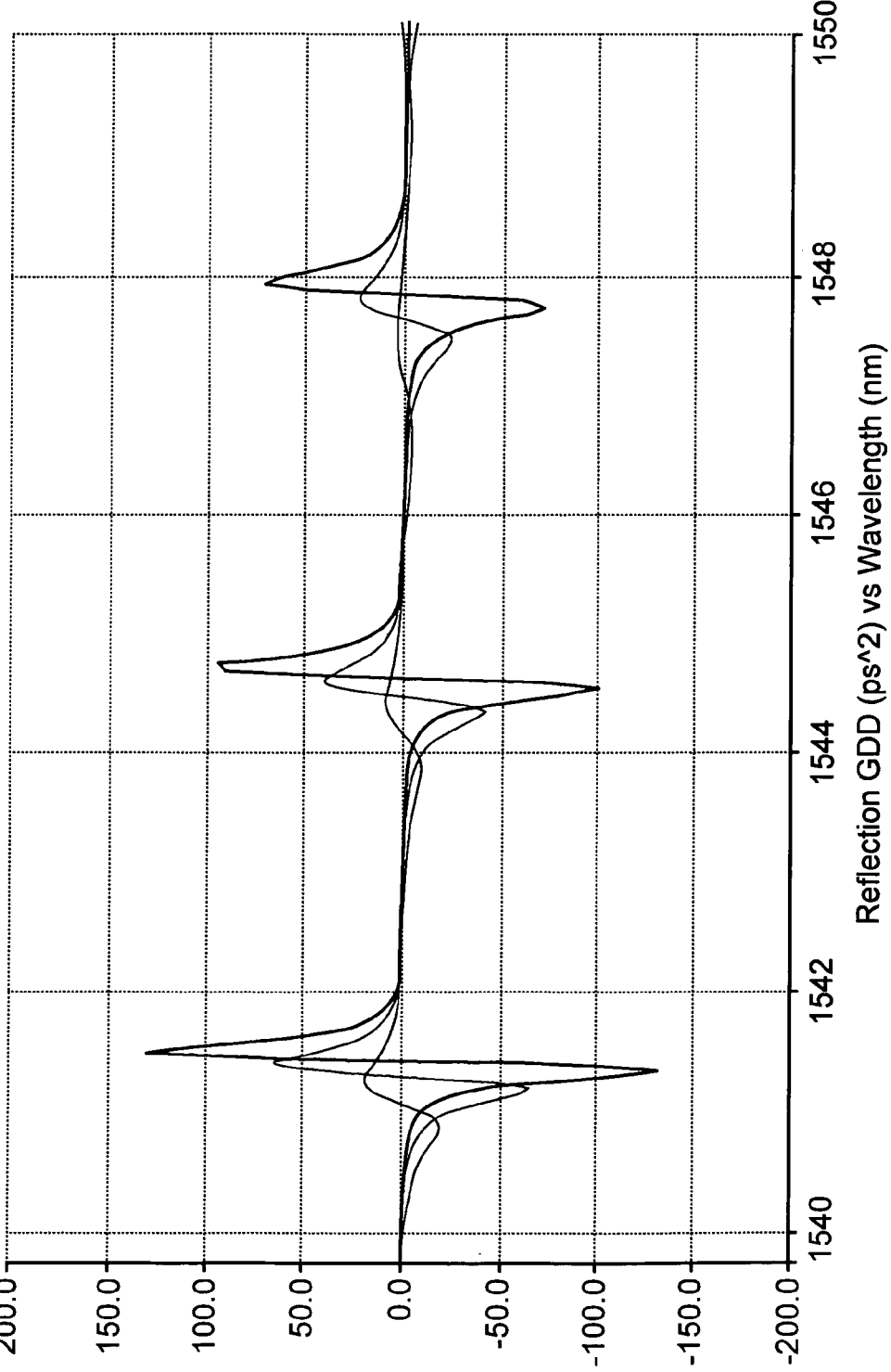
FIG. 5 shows the group delay dispersion of the etalon at three different temperatures.

FIG. 4 shows the group delay in ps over the same band. This was plotted for three different temperatures, which were chosen to produce a 2%, 3%, and 4% modulation of the index of refraction within the thermo-optically tunable thin film filter. FIG. 5 shows the group delay dispersion in $ps^2$ for the same structure as was depicted in FIG. 4 and for the same three temperatures. As is evident in FIG. 5, the group delay dispersion may be adjusted thermally over a substantial range.

In summary, the optical element described herein has the following characteristics. Its optical properties are spectrally periodic according to the free spectral range. The device as a whole has the form of a GTI, so it is highly reflective for all channels and all conditions. And its group delay dispersion slope may be thermo-optically tuned over a wide range. Moreover, the described device is much simpler than previous solutions and can be fabricated using low cost materials and depositions.

Figure 6:
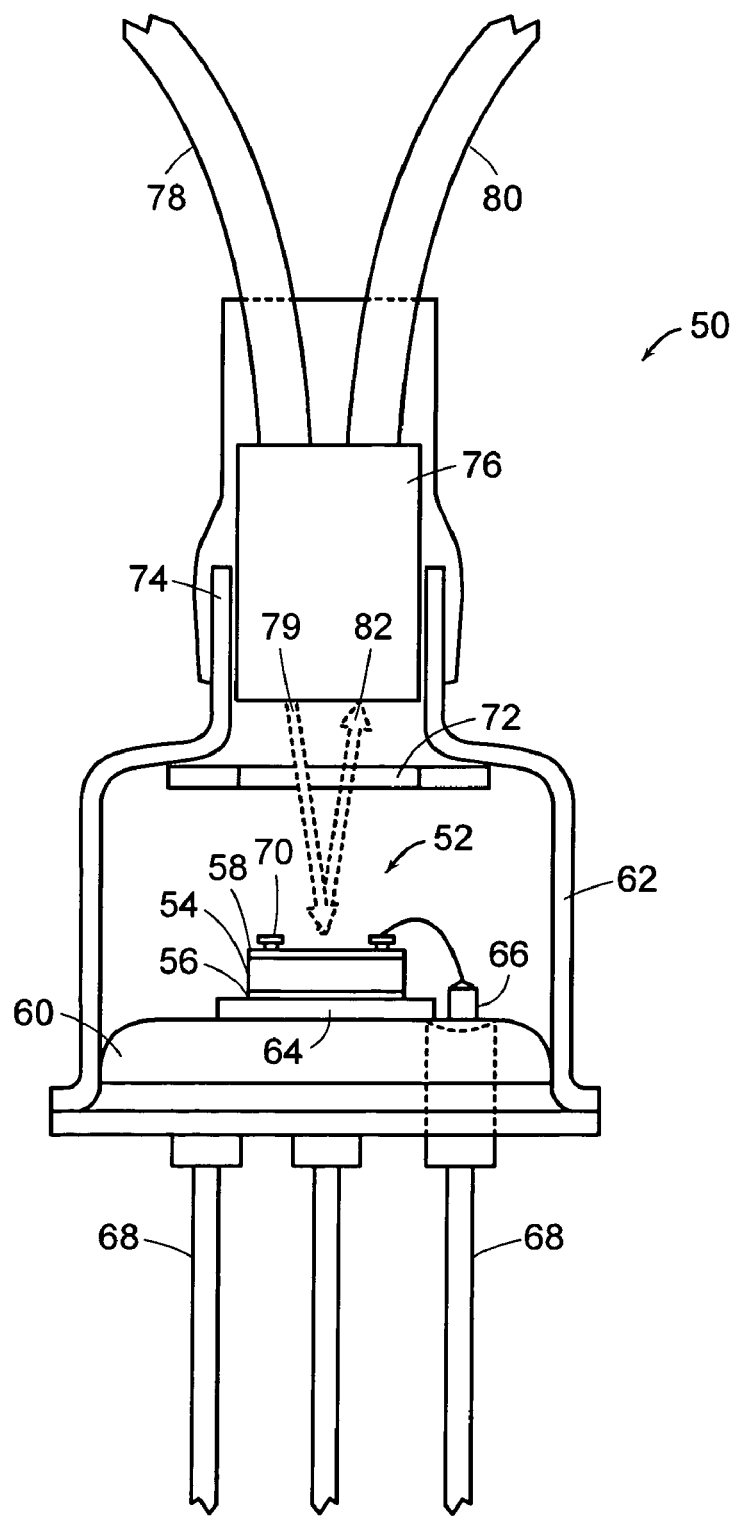
FIG. 6 shows a dispersion compensator device.

A complete dispersion compensator device 50, which incorporates a GTI etalon 52, is shown in FIG. 6. As previously noted, etalon 52 is formed by a transparent spacer 54 with a highly reflective backing coating 56 formed on its back side and a thermo-optically tunable thin film optical filter 58 formed on its front side. It is inside of a TO package which includes a header 60 and a cap 62 mounted on header 60. Etalon 52 is affixed to a thermally insulating material 64 (e.g. ceramic) which, in turn, is affixed to a top surface of header 60. Header 60 includes a group of conducting pins 66 extending down through header 60 and connecting to wire leads 68, through which electrical connection is made to a heater element 70 (e.g. heating ring) on etalon 52. In the top of cap 62, there is a window 72 with its perimeter sealed to the metal of the cap. An integrally formed, metal ferrule 74 extends upward from the main body of cap 62 and surrounds window 72. Ferrule 74 holds a dual fiber collimator 76, which in this example is a GRIN lens (GRadient INdex lens). One optical fiber 78 for carrying an input optical signal 79 and another optical fiber 80 for carrying a reflected optical signal 82 are coupled to the upper end of collimator 76. The relative alignment of etalon 52 and collimator 76 is such that the reflected optical signal enters collimator 76 and is directed into output fiber 80.

Thermo-Optically Tunable Thin Film Structures

The thermo-optically tunable thin film structures that are used in the described embodiment are discussed in detail in earlier filed patent applications and earlier publications including: U.S. Ser. No. 10/005,174, filed Dec. 4, 2001, entitled "Tunable Optical Filter"; U.S. Ser. No. 10/174,503, filed Jun. 17, 2002, entitled "Index Tunable Thin Film Interference Coatings"; and U.S. Ser. No. 10/211,970, filed Aug. 2, 2002, entitled "Tunable Optical Instruments;" L. Domash, E. Ma, N. Nemchuk, A. Payne and M. Wu, "Tunable Thin Films Based on Thermo-optic Semiconductor Films," in Applications of Photonics Technology, Volume 5, Ed. R. Lessard, Proc. SPIE Vol. 4833, 2002; and L. Domash, M. Wu, N. Nemchuk and R. Murano, "Switchable Thin Film Add/Drop Filter," Postdeadline Paper PD35, Optical Fiber Conference, Optical Society of America, Atlanta, Mar. 27, 2003; and L. Domash, M. Wu, N. Nemchuk, and E. Ma, "Tunable and Switchable Multiple-Cavity Thin Film Filters," Journal of Lightwave Technology, vol. 22, pp. 126–134, January 2004, all of which are incorporated herein by reference.

This thin film technology takes advantage of the large thermo-optic coefficients of direct deposited semiconductors, primarily amorphous silicon (a-Si:H) to produce thin film devices with tunable or dynamic properties. By varying the temperature of the resulting structure, the index of the semiconductor films can be controlled over a significant range up to 4%. This, in turn, causes the spectral properties of the thin film filters to be tuned or modulated. With this technology, one can make wavelength tunable single cavity Fabry-Perot filters and multi-cavity tunable filters having bandpass characteristics that shift in wavelength as a function of the temperature of the devices.

A basic thin film dynamic mirror (i.e., adjustable mirror) is made by alternating ¼-wave layers of high and low index materials. Although thin film structures are fabricated by many different deposition processes, semiconductors may be advantageously deposited by PECVD, using amorphous silicon (n=3.73) and silicon nitride (n=1.77). Amorphous silicon has good transparency at 1550 nm and also a large thermo-optic index coefficient; whereas silicon nitride has a smaller thermo-optic coefficient. This combination leads to a physically and chemically stable and robust structure whose large index contrast (3.73/1.77) produces efficient mirrors with relatively few layers. Internal heater films or conductive substrates (e.g. doped silicon) are integrated with the optical film stack for relatively fast response times (e.g. ~ms) and lower power consumption. For both single and multi-cavity filters, thermal coefficients of tuning of center wavelength are on the order of 90–175 pm/° C. Tuning ranges of 37 nm are typical.

The back mirror, though described above as being a thin film of a highly reflecting metal (e.g. gold), can be fabricated by other means. For example, it could be implemented as a multi-layer dielectric thin film stack or as a highly reflecting film in a combination with such a stack.

Other embodiments are within the following claims.

What is claimed is:

1. An optical dispersion compensator comprising:
   a spacer element having a top surface and a bottom surface;
   a thin film, multi-layer mirror formed on the top surface of the spacer element, said thin film mirror having a thermally tunable reflectivity;
   a highly reflective mirror element formed on the bottom surface of the spacer element; and
   a heater element comprising at least one of a resistive layer formed within said thin film mirror and a ring heater formed on one surface of said thin film mirror, the heater element controlling a temperature of said thin film mirror, thereby controlling a reflectivity of said thin film mirror.

2. The optical dispersion compensator of claim 1, wherein the thermally tunable thin film mirror is a multi-layer thin film interference structure.

3. The optical dispersion compensator of claim 2, wherein the thermally tunable thin film mirror is a thermo-optically tunable thin film mirror.

4. The optical dispersion compensator of claim 3, wherein the spacer, the thermo-optically tunable thin film mirror and the highly reflective mirror in combination form a thermally tunable optical element, said optical dispersion compensator further comprising:
   an input optical fiber arranged to deliver an optical signal to the thermally tunable optical element through the optical filter; and
   an output optical fiber arranged to receive an optical signal that has been reflected by said thermally tunable optical element.

5. The optical dispersion compensator of claim 4, wherein the thermally tunable optical element is an all-pass filter.

6. The optical dispersion compensator of claim 4, wherein the highly reflective mirror comprises a thin film of metal.

7. The optical dispersion compensator of claim 6, wherein the mirror comprises a gold film.

8. The optical dispersion compensator of claim 4, wherein the mirror comprises a dielectric thin film stack.

9. The optical dispersion compensator of claim 4, wherein the thermo-optically tunable thin film mirror comprises a semiconductor material.

10. The optical dispersion compensator of claim 9, wherein the semiconductor material is silicon.

11. The optical dispersion compensator of claim 10, wherein the silicon is amorphous silicon.

12. The optical dispersion compensator of claim 4 further comprising a dual fiber collimator which optically couples the first and second optical fibers to the thermally tunable optical element.

13. The optical dispersion compensator of claim 12, wherein the dual fiber collimator is a GRIN lens.

14. An optical dispersion compensator comprising:
   a Gires-Tournois etalon with a spacer section having a top surface supporting a thin film, multi-layer mirror having a thermally tunable reflectivity and a bottom surface supporting a mirror element; and
   a heater element comprising at least one of a resistive layer formed within the thin film, multi-layer mirror and a ring heater formed on one surface of the thin film, multi-layer mirror, the heater element controlling a temperature of the thin film, multi-layer mirror, thereby controlling reflectivity of the thin film, multi-layer mirror.

15. The optical dispersion compensator of claim 14, wherein the thermally tunable thin film mirror is a multi-layer thin film interference structure.

16. The optical dispersion compensator of claim 15, wherein the thermally tunable thin film mirror is a thermo-optically tunable thin film mirror.

17. The optical dispersion compensator of claim 16, wherein the spacer, the thermally tunable thin film mirror and the bottom mirror in combination form a thermally tunable optical element, said optical dispersion compensator further comprising:
   an input optical fiber arranged to deliver an optical signal to the thermally tunable optical element through the optical filter; and
   an output optical fiber arranged to receive an optical signal that has been reflected by said thermally tunable optical element.

18. The optical dispersion compensator of claim 17 further comprising a dual fiber collimator which optically couples the first and second optical fibers to the thermally tunable optical element.

19. The optical dispersion compensator of claim 18, wherein the dual fiber collimator is a GRIN lens.

20. The optical dispersion compensator of claim 17 further comprising a second heater element for controlling a temperature of the spacer.

* * * * *